(12) United States Patent
Zerbe

(10) Patent No.: US 7,706,524 B2
(45) Date of Patent: Apr. 27, 2010

(54) SIGNAL LINE ROUTING TO REDUCE CROSSTALK EFFECTS

(75) Inventor: Jared L. Zerbe, Woodside, CA (US)

(73) Assignee: Rambus Inc., Los Altos, CA (US)

( * ) Notice: Subject to any disclaimer, the term of this patent is extended or adjusted under 35 U.S.C. 154(b) by 1736 days.

(21) Appl. No.: 09/993,138

(22) Filed: Nov. 16, 2001

(65) Prior Publication Data

US 2003/0099190 A1  May 29, 2003

(51) Int. Cl.
*H04M 1/00* (2006.01)
(52) U.S. Cl. .................................... 379/351
(58) Field of Classification Search ............ 379/142.07, 379/142.05, 351
See application file for complete search history.

(56) References Cited

U.S. PATENT DOCUMENTS

| | | | | |
|---|---|---|---|---|
| 2,038,240 | A * | 4/1936 | Schelkunoff | 333/1 |
| 2,070,744 | A * | 2/1937 | Nyquist | 379/347 |
| 3,764,727 | A * | 10/1973 | Balde | 174/34 |
| 4,486,739 | A * | 12/1984 | Franaszek et al. | 341/59 |
| 4,665,517 | A | 5/1987 | Widmer | |
| 5,414,393 | A * | 5/1995 | Rose et al. | 379/417 |
| 5,618,185 | A * | 4/1997 | Aekins | 439/941 |
| 5,673,009 | A * | 9/1997 | Klas et al. | 379/417 |
| 5,740,201 | A | 4/1998 | Hui | |
| 6,057,743 | A * | 5/2000 | Aekins | 439/941 |
| 6,067,594 | A | 5/2000 | Perino | |
| 6,137,455 | A | 10/2000 | Duo | |
| 6,154,498 | A | 11/2000 | Dabral | |
| 6,278,740 | B1 | 8/2001 | Nordyke | |
| 6,359,931 | B1 | 3/2002 | Perino | |
| 6,464,541 | B1 * | 10/2002 | Hashim et al. | 439/676 |
| 6,556,628 | B1 | 4/2003 | Poulton | |
| 6,700,958 | B2 * | 3/2004 | Hinderks | 379/93.31 |
| 2002/0041510 | A1 * | 4/2002 | Shimazaki et al. | 365/63 |
| 2003/0002474 | A1 * | 1/2003 | Alexander et al. | 370/351 |
| 2003/0095606 | A1 | 5/2003 | Horowitz | |

OTHER PUBLICATIONS

Mircea R. Stan, Wayne P. Burleson, "Bus-Invert Coding for Low Power I/O," IEEE Transactions on Very Large Scale Integration (VLSI) Systems, vol. XX, No. Y, Month 1999, pp. 100-108.
Carusone et al., "Differential Signaling with a Reduced Number of Signal Paths", IEEE Transactions on Circuits and Systems—II: Analog and Digital Signal Processing, Mar. 2001, pp. 294-300, vol. 48, No. 3.
Marsland et al., "A Network Multi-Processor for Experiments in Parallelism", Mar. 31, 1991, pp. 1-29.
Stan, Mircea and Burleson, W.P., "Bus-Invert Coding for Low Power I/O", IEEE Transactions on Very Large Scale Integration Systems, vol. XX, No. Y, 1999.
Stan, Mircea and Burleson, W.P., "Coding a Terminated Bus for Low Power", Great Lakes Symposium on VLSI, pp. 70-73, Mar. 1995.
Widmer, A.X. and Franaszek, P.A., "A DC-Balanced, Partioned-Block, 8B/10B Transmission Code," IBM J. Res. Develop., vol. 27, No. 5, Sep. 1983, pp. 440-451.

* cited by examiner

*Primary Examiner*—Alexander Jamal
(74) *Attorney, Agent, or Firm*—Mahamedi Paradice Kreisman LLP

(57) ABSTRACT

Described herein is a technique for reducing the effects of crosstalk between adjacent signal lines of a data path. The data path is formed by multiple signal lines arranged adjacent each other and traversing multiple segments. The signal lines are transposed between segments in a manner that is chosen to reduce differences in interline couplings between different pairs of the signal lines. The interline coupling of a pair of signal lines is represented as a function of coupling terms. A coupling term corresponds to each segment of a pair of signal lines, and is a function of the distance between the signal lines over that segment. Prior to transmitting a digital signal over the data path, the digital signal is encoded to reduce variations over time in a collective signal level of the digital signal.

16 Claims, 2 Drawing Sheets

SIGNAL LINE ROUTING TO REDUCE CROSSTALK EFFECTS

TECHNICAL FIELD

The invention relates to reducing the effects of crosstalk in signal interconnections.

BACKGROUND

When two signal lines are placed near each other, they tend to couple to one another either magnetically, capacitively, and/or inductively. The result, referred to as "crosstalk" or "cross-coupling," is that variations in one signal affect amplitudes of nearby signals.

Crosstalk tends to degrade system performance by introducing variable and unpredictable components to signals. Existing techniques to reduce coupling between conductors include adding ground conductors between signal conductors or positioning the signal conductors farther away from one another. However, the addition of ground conductors between signal conductors increases the number of conductors, thereby increasing the cost and complexity of the system. Further, if the conductors are traces on a printed circuit board, the addition of ground conductors between signal conductors increases the printed circuit board area required to route all of the conductors. Positioning the signal conductors farther away from one another increases the size of the printed circuit board, connector, integrated circuit package, or other device that handles the conductors.

The interconnection technique described below takes a different approach by attempting to mitigate the effects of crosstalk rather than attempting to eliminate coupling between signal lines.

DETAILED DESCRIPTION

Figure 1:
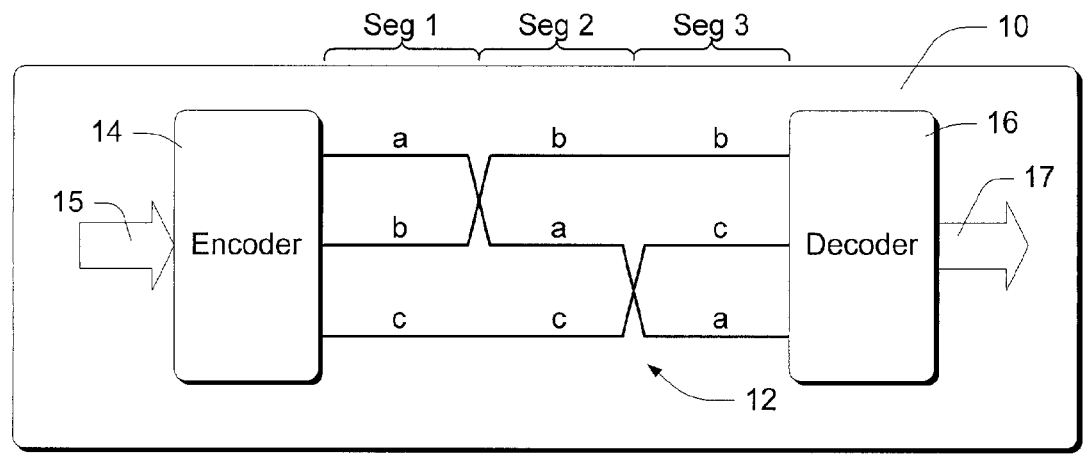
FIGS. 1-4 are block diagrams illustrating different interconnection embodiments in accordance with the invention.

FIG. 1 shows an embodiment of a signal transmission system incorporating elements of the invention. The system of FIG. 1 includes a planar substrate 10 upon which various signal lines and components are fabricated and/or mounted. Planar substrate 10 in this embodiment is a conventional printed circuit board, and in many cases will comprise a multi-layer printed circuit board. Although FIG. 1 shows only those components that are relative to the invention, it is assumed that the circuit board might serve any of a great number of different functions, and that the illustrated elements form only a relatively small part of overall circuits that are implemented on the circuit board. Furthermore, a particular circuit board might include multiple signal transmission systems such as the one shown in FIG. 1.

The system of FIG. 1 includes a data path or interconnection 12 between two components. Interconnection 12 comprises three or more adjacent conductors, traces, or signal lines, which in this example are individually labeled as "a", "b", and "c". Although only three signal lines are shown in this example, further examples, described below, will illustrate the described techniques in the context of more than three signal lines.

The signal lines are configured to communicate a digital signal in the form of voltages or currents that indicate numeric values. In a binary signaling system, for example, each signal line is driven between two different voltage or current amplitudes to indicate either a binary "0" value or a binary "1" value. In a multi-level signaling system, each signal line has more than two possible amplitudes. For example, each conductor might have four possible amplitudes, allowing each signal line to represent a "0", "1", "2", or "3".

In the embodiment of FIG. 1, the source of the digital signal carried by interconnection 12 is an encoder 14 that receives an unencoded signal 15 and that encodes the signal in a manner that reduces variations over time in a collective signal level of the digital signal. Thus, for example, if the signal lines of data path 12 are designed to operate at discrete current amplitudes, the object of the encoding is to ensure that the total current—through the combined signal lines—remains relatively constant. If the signal lines are designed to operate at discrete voltage amplitudes, the object of the encoding is to ensure that the average voltage of the collective signal lines remains relatively constant. In a binary system, this typically involves encoding data in a manner such that each possible value involves a similar number of 1's and 0's when encoded and presented on the signal lines of interconnection 12.

There are various binary data encoding schemes that achieve this goal. An encoding scheme known as the IBM 8B-10B code is one example, being designed to produce a balanced number of ones and zeros in a code stream. The IBM 8B-10B code is described in U.S. Pat. No. 4,665,517. Although the IBM 8B-10B code is described as providing a balanced number of ones and zeroes over time, the same concepts can be used to provide a balanced number of zeroes and ones across a parallel, binary word. An alternative encoding scheme, for use in conjunction with a four-level signaling scheme, is described in a co-pending U.S. Patent Application filed concurrently herewith, entitled "Method and Apparatus for Multi-Level Signaling" by inventors Mark A Horowitz, Scott C. Best, and William F. Stonecypher, having Ser. No. 09/992,911, which is hereby incorporated by reference. Note that although these encoding schemes do not completely eliminate variations in collective signal levels, they reduce such variations to levels significantly below what they would otherwise be.

The encoded digital signal is communicated by interconnection 12 and received by a decoder 16. Decoder 16 decodes the encoded signal in accordance with whatever data encoding scheme has been implemented by encoder 14, and produces a decoded signal 17.

Although the invention can be implemented beneficially without the noted forms of data encoding, the invention is especially beneficial in conjunction with such data encoding. This will become apparent as the discussion proceeds.

The signal lines of interconnection 12 traverse a plurality of segments. In the example of FIG. 1, there are three segments: segment 1 ("Seg 1"), segment 2 ("Seg 2"), and segment 3 ("Seg 3").

Various ones of the signal lines are transposed between the segments. Alternatively, the segments can be considered to be defined or delineated by the points at which the signal lines are transposed. There is a signal transposition involving signal lines a and b at a point one third of the total distance from the left side of interconnection 12, and the boundary between segments 1 and 2 is defined by this transposition. There is a signal line transposition involving signal lines a and c at a point two thirds of the total distance from the left side of interconnection 12, and the boundary between segments 2 and 3 is defined by this transposition.

Assuming that substrate 10 is a multilevel circuit board, the signals can be transposed by using different levels of the circuit board. In this case the different levels are accessed by conventional vias. Alternately, the signals can be transposed by the locations of their traces on the PCB board. In the described embodiment, however, the signals are transposed by use of a second PCB layer and conventional vias.

The signal line transpositions result in a different order of signal lines for each segment. In this example, the order in segment 1 is {a, b, c}, the order in segment 2 is {b, a, c}, and the order in segment 3 is {b, c, a}. Note that in FIG. 1 the line designations (a, b, and c) are repeated in each segment for clarification.

The signal line transpositions are designed to reduce or minimize differences between interline couplings of different pairs of the signal lines. In the described embodiment, the interline coupling for two signal lines is represented by a calculated parameter that is a function of the actual distances between the two signal lines over all the segments traversed by the signal lines.

Generally, the interline coupling for a given pair of signal lines can be calculated as a function of multiple coupling terms, wherein there is a potentially different coupling term for each segment. The coupling term for a particular segment is based on both the length of the segment and on the distance between the signal lines as they traverse the segment.

Depending on the level of analysis, the coupling term might be calculated based on different assumptions with regard to distance. At a first level of approximation, for example, it might be assumed that the coupling term has an inverse linear relationship with distance. Alternatively, it might be assumed that the coupling term is inversely related to the square of the distance. The length of the segment is generally considered to be a multiplicative factor.

For purposes of the following discussion, the coupling term for a particular pair of signal lines m and n over a segment s will be referred to as $C(m, n, s)$. The interline coupling for a pair of signal lines m and n will be represented by an interline coupling parameter $P(m, n)$ that is equal to or is a function of the summation of the coupling terms of the pair over all segments s: $P(m, n) = \Sigma C(m, n, s)$ over all segments s. Using the simplifying assumption that coupling is related linearly to distance, the coupling term $C(m, n, s)$ will be considered to be equal to the distance between conductors as they traverse segment s, multiplied by the length of segment s. In other words, $C(m, n, s) = D(m, n, s) \times L(s)$; where $D(m, n, s)$ is the distance between conductors m and n as they traverse segment s, and $L(s)$ is the length of segment s.

Thus, in accordance with the simplifications given above:

$P(m, n) = \Sigma(D(m, n, s) \times L(s))$ over all segments s  (equation 1)

A further simplification can be made when all segments are the same length. In this case, the length can be disregarded, and the interline coupling parameter is as follows:

$P(m, n) = \Sigma D(m, n, s)$ over all segments s  (equation 2)

In the specific example of FIG. 1, assuming that each signal line is one unit of distance from its adjacent signal line, the actual distance between lines a and b over segment 1 in FIG. 1 is equal to one unit. The distance between these two lines over segment 2 is again one unit. However, the distance between lines a and b over segment 3 is two units. In accordance with the equation given above, the interline coupling parameter between signal lines a and b equals the summation of the actual distances over all three segments: in this case, 1+1+2=4.

Table 1 below gives the interline coupling parameter $\Sigma P(m, n)$ for each possible pair of signal lines in the embodiment of FIG. 1.

TABLE 1

| Pair (m, n) | D(m, n, Seg 1) | D(m, n, Seg 2) | D(m, n, Seg 3) | Sum: P(m, n) |
|---|---|---|---|---|
| (a, b) | 1 | 1 | 2 | 4 |
| (b, c) | 1 | 2 | 1 | 4 |
| (a, c) | 2 | 1 | 1 | 4 |

As can be seen from Table 1, the sums of the coupling terms of the different pairs of signal lines are all equal—they are all equal to four. This is the result of the transpositions of signal lines between segments. Specifically, the transpositions are made in such a way that the interline coupling parameters $P(m, n)$ become equal, as nearly as possible, for all pairs of signal lines.

Note while that the example shown in FIG. 1 equalizes the interline coupling parameters by only judicious choices of transposition, other examples might also vary the lengths of the different segments to equalize the interline coupling parameters.

This technique of reducing differences in interline coupling tends to simply equalize the amount of crosstalk that occurs between different pairs of signal lines. In the example of FIG. 1, signal line a is subject to the same amount of crosstalk from signal line b as from signal line c. Similarly, signal line b is subject to the same amount of crosstalk from signal lines a and c. Finally, signal line c is subject to this same amount of crosstalk from signal lines a and b.

This characteristic is especially beneficial in conjunction with the encoding methods described above. One side-effect of the described encoding methods is that each change in state tends to involve a nearly equal number of signals which simultaneously experience positive-going and negative-going transitions. Furthermore, as a result of the described signal line transpositions, each signal line is subject to a similar amount of crosstalk from each of the other signal lines. Thus, a positive-going transition on one neighboring line will have the same degree of effect on a given signal line as a negative-going transition on another neighboring signal line. The result is that any positive-going transitions in neighboring signal lines will tend to be canceled by accompanying negative-going transitions in others of the neighboring signal lines— reducing any potentially harmful effects of crosstalk.

Figure 2:
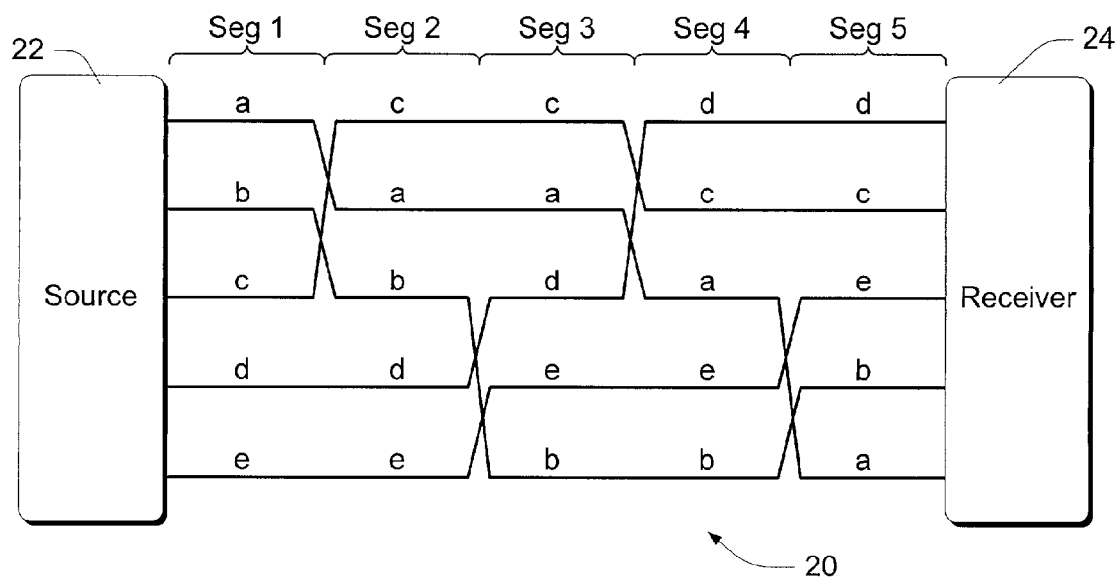

FIG. 2 shows a more complex example of an interconnection 20 involving five signal lines a, b, c, d, and e that extend from a source device 22 to a receiving device 24. In this example, it is assumed that the source device performs appropriate encoding to reduce variations over time in the collective signal level of the signal carried by the signal lines, and that the receiving device 24 perform the inverse decoding. Note also that the interconnection might be bi-directional and might also form a multiple-drop data communications bus in which different devices drive signals onto the signal bus at different times.

Although not illustrated in FIG. 2, interconnection 20 can be formed on or within a planar substrate such as illustrated in FIG. 1. Alternatively, interconnection 20 might comprise a cable or some other type of data path formed of individual conductors. The exemplary embodiments disclosed herein utilize interconnections in which signal lines are arranged in a two-dimensional or approximately planar relationship to each other. In addition to the circuit board configuration already described, a ribbon cable is another example of a relatively planar (albeit flexible) interconnection structure in which the relative position, order, or sequence of adjacent conductors can be changed at intermediate points along the signal path to achieve variable line orderings along the length of the interconnection. Furthermore, the principles disclosed herein are also applicable to interconnections that are arranged in a 3-dimensional or non-planar configuration.

The interconnection shown in FIG. 2 has five segments of equal length, defined by signal line transpositions at intermediate points along the interconnection. Signal lines a, b, and c are transposed between segments 1 and 2; signal lines b, d, and e are transposed between segments 2 and 3; signal lines c, a, and d are transposed between segments 3 and 4; and signal lines a, e, and b are transposed between segments 4 and 5. This results in the following orderings of signal lines within each of the five segments:

Segment 1:{a, b, c, d, e}
Segment 2:{c, a, b, d, e}
Segment 3:{c, a, d, e, b}
Segment 4:{d, c, a, e, b}
Segment 5:{d, c, e, b, a}

As in the previous example, the transpositions and orderings shown in FIG. 2 are chosen to reduce variations in interline coupling between different pairs of signal lines. Interline coupling parameters are calculated as before, by summing the distances between signal lines over all the segments. Table 2, below, lists the interline coupling parameters for each pair of signal lines.

TABLE 2

| Pair (m, n) | D(m, n, Seg 1) | D(m, n, Seg 2) | D(m, n, Seg 3) | D(m, n, Seg 4) | D(m, n, Seg 5) | Sum: P(m, n) |
|---|---|---|---|---|---|---|
| (a, b) | 1 | 1 | 3 | 2 | 1 | 8 |
| (a, c) | 2 | 1 | 1 | 1 | 3 | 8 |
| (a, d) | 3 | 2 | 1 | 2 | 4 | 12 |
| (a, e) | 4 | 3 | 2 | 1 | 2 | 12 |
| (b, c) | 1 | 2 | 4 | 3 | 2 | 12 |
| (b, d) | 2 | 1 | 2 | 4 | 3 | 12 |
| (b, e) | 3 | 2 | 1 | 1 | 1 | 8 |
| (c, d) | 1 | 3 | 2 | 1 | 1 | 8 |
| (c, e) | 2 | 4 | 3 | 2 | 1 | 12 |
| (d, e) | 1 | 1 | 1 | 3 | 2 | 8 |

Note that the configuration of FIG. 2 does not completely equalize the interline coupling parameters P(m, n) of the different pairs of signal lines. Nevertheless, differences in interline coupling parameters have been reduced to a ratio of no more than 12:8 or 1.5:1. In comparison, the highest ratio in the absence of the signal transpositions would have been 4:1. Thus, the configuration shown in FIG. 2 achieves a significant improvement.

The embodiment of FIG. 2 is especially applicable in conjunction with the multi-level encoding scheme described the co-pending patent application mentioned above. That application describes a system utilizing five signal lines to convey a parallel data byte in a manner that reduces variations in total current drawn by the parallel signals. Specifically, that system is capable of reducing maximum switching current variations within a pin group by a factor of twelve. When used in conjunction with the signal line transposition techniques described herein, the result is a system having significantly less effects from signal line cross-coupling. This is a result of the combination of reduced total switching current variations within a group (described in the co-pending Application) and the balanced coupling between individual signals as described herein.

Figure 3:
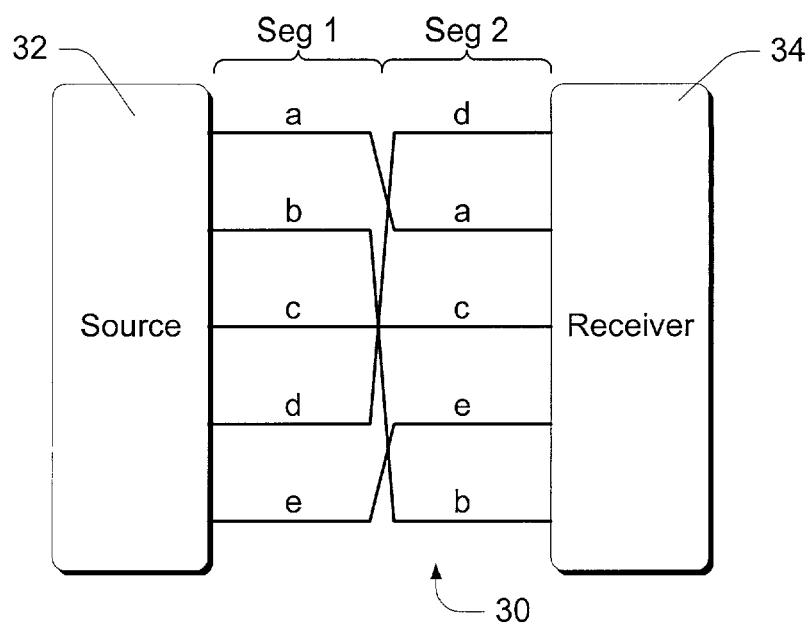

FIG. 3 shows another example of an interconnection 30 in accordance with the invention, in a system involving five signal lines, a, b, c, d, and e that extend from a source device 32 to a receiving device 34. Again, it is assumed that the source device performs appropriate encoding to reduce variations over time in the collective signal level of the signal lines, and that the receiving device 34 perform the inverse decoding.

In this example, the interconnection has only two segments, defined by signal line transpositions at a single, midway location along the interconnection. At this location, the signals are transposed to achieve the following signal line orderings within the two segments:

Segment 1:{a, b, c, d, e}
Segment 2:{d, a, c, e, b}

The transpositions and orderings shown in FIG. 2 are chosen to reduce variations in interline couplings between different pairs of signal lines. Interline coupling parameters are calculated by summing the distances between signal lines over both of the segments. Table 2, below, lists the interline coupling parameters for each pair of signal lines.

TABLE 3

| Pair (m, n) | D(m, n, Seg 1) | D(m, n, Seg 2) | Sum: P(m, n) |
|---|---|---|---|
| (a, b) | 1 | 3 | 4 |
| (a, c) | 2 | 1 | 3 |
| (a, d) | 3 | 1 | 4 |
| (a, e) | 4 | 2 | 6 |
| (b, c) | 1 | 2 | 3 |
| (b, d) | 2 | 4 | 6 |
| (b, e) | 3 | 1 | 4 |
| (c, d) | 1 | 2 | 3 |
| (c, e) | 2 | 1 | 3 |
| (d, e) | 1 | 3 | 4 |

This configuration reduces differences between interline coupling parameters to a ratio of 6:3 or 2:1, which is not as good as the configuration of FIG. 2. On the other hand, the configuration of FIG. 3 involves only two segments versus the five segments of FIG. 2. In some applications, the reduced number and correspondingly reduced expense of signal line transpositions might justify the less effective reduction in crosstalk effects. Again, the largest ratio of interline coupling parameters in the absence of the signal line transpositions would have been 4:1. Thus, even the configuration shown in FIG. 3 is a significant improvement over this ratio.

Figure 4:
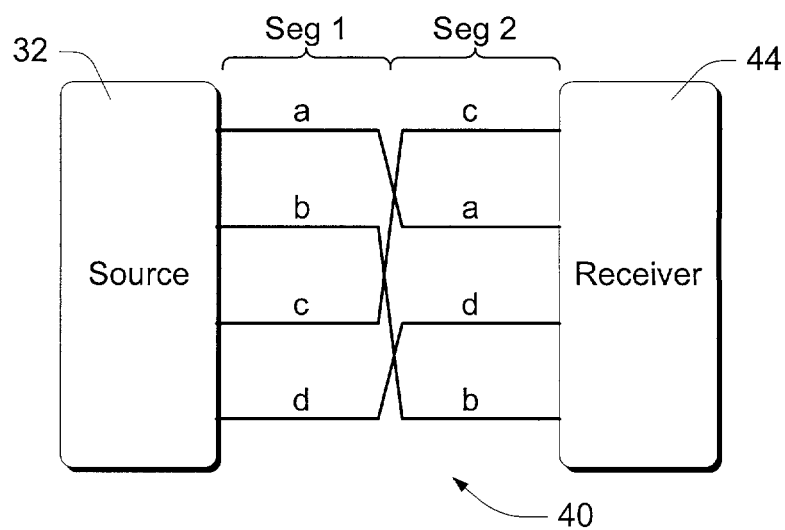

FIG. 4 shows another example of an interconnection 40 in accordance with the invention, in a system involving four signal lines, a, b, c, and d that extend from a source device 42 to a receiving device 44. The source device performs appropriate encoding to reduce variations in the collective signal level of the signal lines over time, and that the receiving device 44 perform the inverse decoding.

In this example, the interconnection has two segments, defined by signal line transpositions at a single, midway location along the interconnection. At this location, the signals are transposed to achieve the following signal line orderings within the two segments:

Segment 1:{a, b, c, d}
Segment 2:{c, a, d, b}

The transpositions and orderings shown in FIG. 4 are chosen to reduce variations in interline coupling between different pairs of signal lines. Interline coupling parameters are calculated by summing the distances between signal lines over both of the segments. Table 4, below, lists the interline coupling parameters for each pair of signal lines.

TABLE 4

| Pair (m, n) | D(m, n, Seg 1) | D(m, n, Seg 2) | Sum: P(m, n) |
|---|---|---|---|
| (a, b) | 1 | 2 | 3 |
| (a, c) | 2 | 1 | 3 |
| (a, d) | 3 | 1 | 4 |
| (b, c) | 1 | 3 | 4 |
| (b, d) | 2 | 1 | 3 |
| (c, d) | 1 | 2 | 3 |

This configuration reduces differences between interline coupling parameters to a ratio of 4:3 or 1.3:1. This is in contrast to a ratio of 3:1 that would have been achieved in the absence of the signal line transpositions.

The techniques described above effectively reduce effects of crosstalk with little or no cost in additional circuit board real estate. Furthermore, the reduced crosstalk effects are achieved without the addition of active devices other than those used for encoding and decoding the signals to reduce variations in collective signal levels.

Although the invention has been described in language specific to structural features and/or methodological steps, it is to be understood that the invention defined in the appended claims is not necessarily limited to the specific features or steps described. Rather, the specific features and steps are disclosed as preferred forms of implementing the claimed invention.

The invention claimed is:

1. A method of routing a signaling link in a communication system which includes a transmitter and a receiver, the signaling link comprising four or more conductive lines that are routed along a path in parallel from the transmitter to the receiver, the method comprising:

equalizing a line-to-line coupling from each line to any one of the other lines in the link traversing an entire length of the link by arranging the link in segments, each segment featuring a routing change to reorder proximity of at least one pair of lines relative to any adjacent segment, with a sufficient number of segments such that each line has each of the other lines of the link as a nearest neighbor for at least a portion of the path.

2. The method of claim 1 further comprising configuring the signaling link for transmitting digital signals encoded in a manner to maintain a substantially constant number of binary ones and binary zeroes.

3. The method of claim 1, wherein the lines are routed such that spacing between adjacent lines is uniform across the four or more lines in the link within each segment and remains constant from segment to segment.

4. The method of claim 1, wherein the line-to-line coupling between two lines traversing an entire length of the link is proportional to a sum of couplings over all segments.

5. The method of claim 4, wherein for each segment, the coupling of at least one pair of adjacent lines is different from any adjacent segment, and wherein the signaling link is segmented such that a ratio between a greatest and a least line-to-line couplings considering any pair of lines is no greater than 2 to 1.

6. The method of claim 1, wherein all segments have the same length.

7. The method of claim 1, wherein at least two segments have different lengths.

8. A signaling link comprising four or more conductive lines that are routed along a path from a start point to an end point comprising:

a first segment of the path in which a first one of the conductive lines bears a first relationship defined by a substantially constant relative distance along the path to a second one of the conductive lines, and a second relationship defined by a substantially constant relative distance to a third one of the conductive lines;

a second segment of the path in which the first one of the conductive lines bears a third relationship defined by a substantially constant relative distance along the path to the second one of the conductive lines, and a fourth relationship defined by a substantially constant relative distance to the third one of the conductive lines, where at least one of (a) the third relationship is not equal to the first relationship, or (b) the fourth relationship is not equal to the second relationship; and a third segment of the path in which the first one of the conductive lines bears a fifth relationship defined by a substantially constant relative distance along the path to the second one of the conductive lines, and a sixth relationship defined by a substantially constant relative distance to the third one of the conductive lines, where (a) the fifth relationship is not equal to at least one of the first relationship or the third relationship, and (b) the sixth relationship is not equal to the at least one of the second relationship or the fourth relationship.

9. The signaling link of claim 8, wherein the conductive lines are fabricated on a printed circuit board.

10. The signaling link of claim 8, wherein the conductive lines are configured to transmit digital signals that are encoded to maintain a substantially constant number of binary ones and binary zeroes.

11. The signaling link of claim 8, wherein all of the first, second, and third segments have the same length.

12. The signaling link of claim 8, wherein at least two of the first, second, and third segments have different lengths.

13. The signaling link of claim 8, wherein a line-to-line coupling between two lines traversing an entire length of the link is proportional to a sum of couplings over all segments.

14. The signaling link of claim 13, wherein for each segment, the coupling of at least one pair of adjacent lines is different from any adjacent segment, and wherein the signaling link is segmented such that a ratio between a greatest and a least line-to-line couplings considering any pair of lines is no greater than 2 to 1.

15. A signaling link comprising four or more conductive lines comprising:

means for segmenting the link, each segment featuring a routing change to reorder proximity of at least one pair of lines relative to any adjacent segment, with a sufficient number of segments such that each line has each of the other lines of the link as a nearest neighbor for at least a portion of the path;

means for encoding data transmitted over the signaling link in a manner to maintain a substantially constant number of binary ones and binary zeros.

16. The signaling link of claim 15 wherein the means for segmenting the link comprising routing the lines such that spacing between adjacent lines is uniform across the plurality of lines in the link within each segment and remains constant from segment to segment.

* * * * *